United States Patent [19]

Mei

[11] Patent Number: 5,585,660
[45] Date of Patent: Dec. 17, 1996

[54] EXTENDED DRAIN RESURF LATERAL DMOS DEVICES

[75] Inventor: Chia-Cu P. Mei, Plano, Tex.

[73] Assignee: Texas Instruments Incorporated, Dallas, Tex.

[21] Appl. No.: 482,065

[22] Filed: Jun. 7, 1995

Related U.S. Application Data

[63] Continuation of Ser. No. 369,973, Jan. 5, 1995, Pat. No. 5,548,147, which is a continuation of Ser. No. 224,919, Apr. 8, 1994, abandoned.

[51] Int. Cl.$^6$ ..................................... H01L 29/76
[52] U.S. Cl. ........................... 257/389; 257/316; 257/335; 257/336; 257/344; 257/395; 257/401; 257/408
[58] Field of Search .................................. 257/347, 316, 257/335, 336, 344, 389, 395, 401, 408

[56] References Cited

U.S. PATENT DOCUMENTS 5,246,870  9/1993  Merchant ................................ 257/347

OTHER PUBLICATIONS

C. A. T. Salama, "Lateral Silcon Devices and High Voltage Integrated Circuits", May 1993.
Zahr Parpia and C. A. T. Salama, "Optimization of Resurf LDMOS Transistors: An Analytical Approach," IEEE Transactions on Electron Devices, vol. 37, No. 3, Mar. 1990.
Taylor Efland, et al, "An Optimized Resurf LDMOS Power Device Module Compatible with Advanced Logic Processes," Texas Instruments Incorporated, Dec. 1992.

Professor B. Jayant Baliga, "Smart Power Technology: An Elephantine Opportunity" (Invited Plenary Session Paper), IEDM 90–3, 1990 IEEE, pp. 1.1.1–1.1.4. no month.

Habekotte, et al., "A Coplanar CMOS Power Switch," IEEE J. Solid–State Circuits, vol. SC–16, pp. 212–226, Jun. 1981.

J. A. Appeals and H. JM. J. Vaes, High Voltage Thin Layer Devices (Resurf Devices), IEDM Proceedings 1979, pp. 238–241. no month.

Primary Examiner—Edward Wojciechowicz
Attorney, Agent, or Firm—Gerald E. Laws; C. Alan McClure; James C. Kesterson

[57] ABSTRACT

A high voltage PMOS or NMOS transistor 7 has improved on-resistance by truncating gate field oxide 43 so that drain region 42 may be implanted closer to channel region 49 than possible otherwise. By shortening the physical distance d2 between drain 42 and channel region 49, the drain to source on-resistance of the high voltage device is reduced and the performance of high voltage device 7 is thereby improved.

16 Claims, 5 Drawing Sheets

EXTENDED DRAIN RESURF LATERAL DMOS DEVICES

This is a continuation of application Ser. No. 08/369,973, filed Jan. 5, 1995, now U.S. Pat. No. 5,548,147, which is a continuation of application Ser. No. 08/224,919 filed Apr. 8, 1994, now abandoned.

FIELD OF THE INVENTION

This invention is in the field of semiconductor integrated circuits and relates primarily to high voltage CMOS devices.

BACKGROUND OF THE INVENTION

Integrated circuits with combined control and driver functions are often referred to as smart power devices. Smart power devices combine high intelligence with low power dissipation. They typically have power Metal Oxide Semiconductor, MOS, Field Effect Transistors, FETs, in their output stages designed to operate at higher voltages, such as 15–80 volts as opposed to the normal Complementary Metal Oxide Semiconductor, CMOS, logic voltage of typically 5 volts or less, and logic devices incorporated on the same integrated circuit so that both a driver function and a controller function are provided in a single chip. Many applications exist for smart power devices such as Liquid Crystal Display, LCD, displays, electro/mechanical devices, automobile electronic devices, projection TV, and even High Definition, HDTV.

A technique for fabricating high voltage, HV, MOS devices is described in an article entitled "High Voltage Thin Layer Devices (RESURF Devices)," IEDM Proceedings, 1979, pp 238–241. This technique uses a shallow lightly doped region between the drain and channel regions of the device. This shallow lightly doped region is referred to as a drift region because of the low amount of current carriers (carriers being electrons or "holes") that are available due to the low level of impurity doping and the device is known as a Reduced Surface Field, RESURF, device.

RESURF techniques are utilized in manufacturing high voltage N-channel Lateral Double Diffused MOS, HV NMOS, devices and high voltage P-channel Lateral Double Diffused MOS, HV PMOS, devices. However, problems exist in designing and manufacturing smart power devices containing such RESURF high voltage devices. Typically the drain to source on-resistance of an HV PMOS device is relatively high. For example, an HV PMOS device described in an article entitled "A Coplanar CMOS Power Switch," IEEE J. Solid-State Circuits, vol. SC-16, pp 212–226, June 1981, uses a lightly doped pinched resistance as the drift region. Similarly, the drain to source on-resistance of an HV NMOS device is dependant on the length of the semiconductive drift region.

Figure 1:
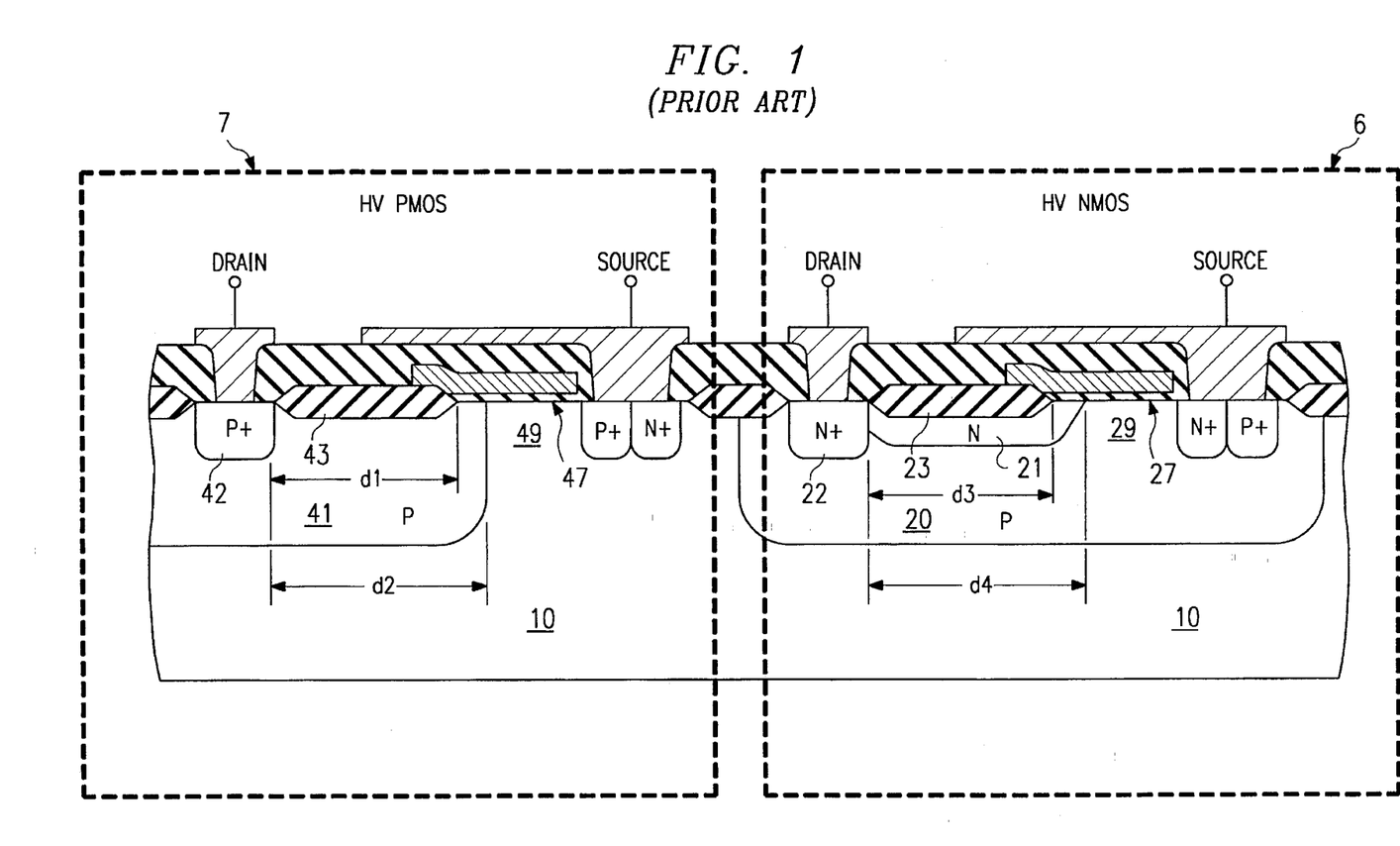
FIG. 1 is a cross-sectional view of a prior art integrated circuit illustrating a typical high voltage PMOS device and a high voltage NMOS device.

FIG. 1 shows a cross-sectional view of an integrated circuit containing a high voltage NMOS device 6 and a high voltage PMOS device 7 made in a conventional manner. HV NMOS device 6 has a drift region 21 between a drain 22 and a channel region 29. A gate field oxide 23 overlies a substantial portion of drift region 21 adjacent to drain 22. When device 6 is turned on, current flowing from drain 22 to channel region 29 passes through drift region 21 and encounters a resistance due to the bulk resistance of the lightly doped n-type material in drift region 21. The amount of this bulk resistance is proportional to a length d4 of drift region 21. Length d4 is dependant on a length d3 of field oxide 23, since drift region 21 must extend past the edge of field oxide 23 where drift region 21 comes in contact with channel region 29. The bulk resistance of drift region 21 may be a significant percentage of the total drain to source on-resistance, $R_{ds(on)}$, of device 6.

Still referring to FIG. 1, HV PMOS device 7 similarly has a drift region 41 between a drain 42 and a channel region 49. A gate field oxide 43 overlies a substantial portion of drift region 41 adjacent to drain 42. When device 7 is turned on, current flowing from channel region 49 to drain 42 passes through drift region 41 and encounters a resistance due to the bulk resistance of the lightly doped p-type material in drift region 41. The amount of this bulk resistance is proportional to a length d2 of drift region 41. Length d2 is dependant on a length d1 of a field oxide 43, since drift region 41 must extend past the edge of field oxide 43 where the drift region 41 comes in contact with channel region 49. The bulk resistance of drift region 41 may be a significant percentage of the total drain to source on-resistance, $R_{ds(on)}$, of device 7.

It is accordingly an object of the invention to provide a simple method to manufacture smart power devices which contain high voltage PMOS and high voltage NMOS devices that have lower on-resistance.

Other objects and advantages will be apparent to those of ordinary skill in the art having reference to the following figures and specification.

SUMMARY OF THE INVENTION

In accordance with the present invention, a gate field oxide which is grown over a RESURF drift region of a high voltage MOS device is truncated so that a drain can be formed closer to a channel region than would be possible otherwise. By shortening the physical distance between the drain and the channel region, the drain to source on-resistance of the high voltage device is reduced and the performance of the high voltage device is thereby improved.

BRIEF DESCRIPTION OF THE DRAWINGS

Corresponding numerals and symbols in the different figures refer to corresponding parts unless otherwise indicated.

DESCRIPTION OF THE PREFERRED EMBODIMENT OF THE INVENTION

A preferred embodiment of the invention is now described. Table A contains a listing of element names and reference numbers used in the drawings and the following description, while Table B provides the function, a specific embodiment and alternate examples of various elements. Tables A and B are incorporated herein and made a part of this specification.

Figure 2:
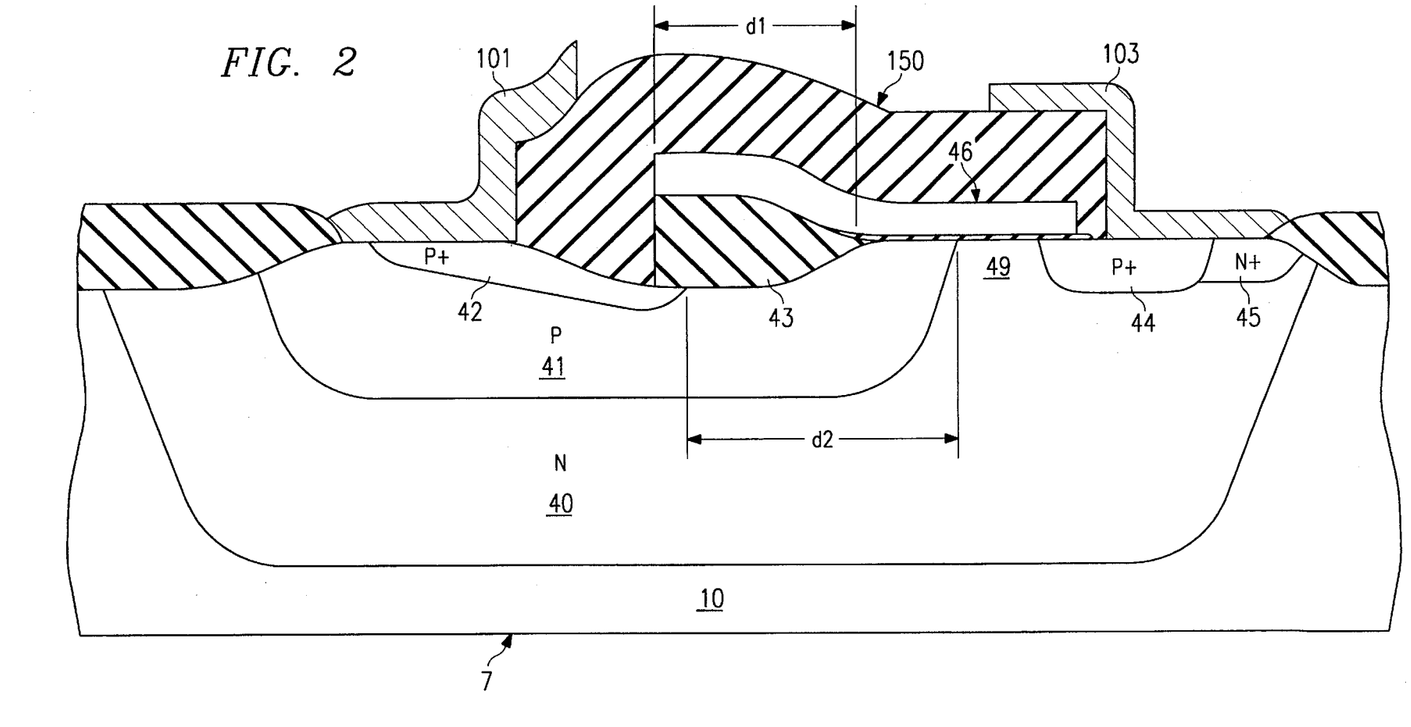
FIG. 2 is a cross-sectional view of an integrated circuit illustrating a high voltage device formed on in accordance with the present invention.

FIG. 2 shows a cross-sectional view of an integrated circuit formed in accordance with the invention containing a high voltage PMOS (HV PMOS) transistor 7. HV PMOS device 7 is formed in a well 40 which isolates HV PMOS device 7 from the semiconductor substrate 10. Substrate 10 is preferably n-type silicon with a relatively high resistivity of approximately 8–12 Ohm-cm.

In FIG. 2, HV PMOS device 7 has a p-tank 41 lying within n-well 40. P-tank 41 provides a RESURF drift region. An HV drain 42 is formed within p-tank 41. An HV source 44 is formed within n-well 40 and is separated from p-tank 41 by a channel region 49. An HV n-well contact 45 is formed within n-well 40. An HV gate field oxide 43 overlies a portion of drift region p-tank 41. A gate oxide 47 overlies channel region 49 and drift region 41, and connects to HV gate field oxide 43. An HV gate electrode 46 overlays gate oxide 47 and gate field oxide 43. Gate field oxide 43 is truncated so that a distance d1 is advantageously smaller than a minimum grown feature size for the process used to grow gate field oxide 43. A drain electrode 101 connects to drain 42. A source electrode 103 connects to source 44 and well contact 45. An inter-level oxide 150 is between gate electrode 46 and drain electrode 101 and source electrode 103. Inter-level oxide 150 electrically insulates gate electrode 46 from drain electrode 101 and source electrode 103.

Referring now to FIGS. 3A–3J, a preferred process for forming a transistor similar to FIG. 2 is described.

Figure 3A:
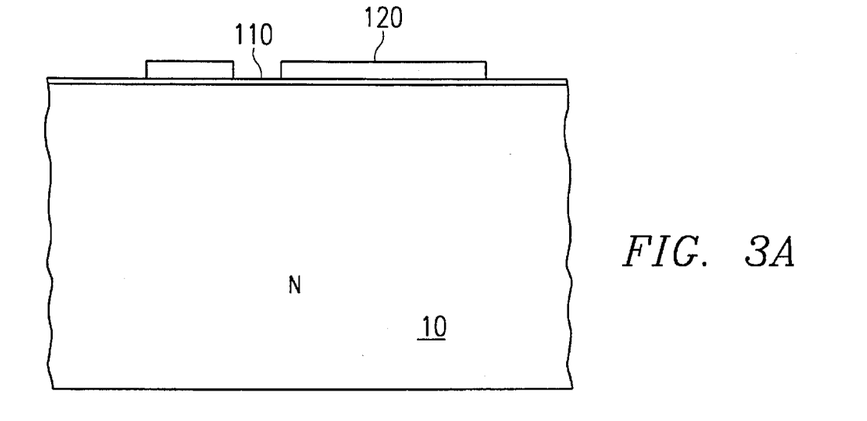
FIGS. 3A–3J are cross-sectional views illustrating a preferred method of constructing a high voltage device similar to FIG. 2 in accordance with the present invention.

FIG. 3A shows n type substrate 10 on which a layer of 1st oxide 110 is grown with a nitride layer 120 deposited on top. Nitride layer 120 is then masked and etched.

Figure 3B:
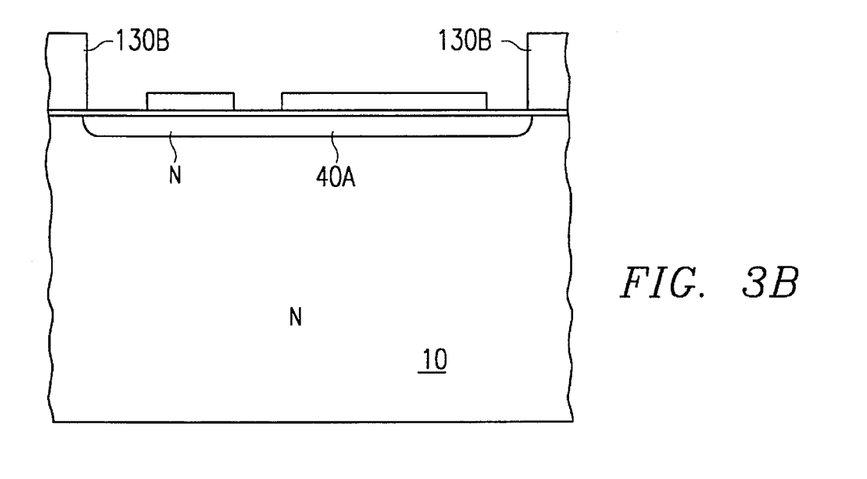

FIG. 3B shows n-type dopant 40A after implantation. N-type dopant 40A can be arsenic or phosphorous, for example. Photoresist 130B blocks the dopant 40A from undesired insertion. The implant occurs through oxide layer 110 and nitride layer 120. Dopant 40A is used to form tank 40.

Figure 3C:
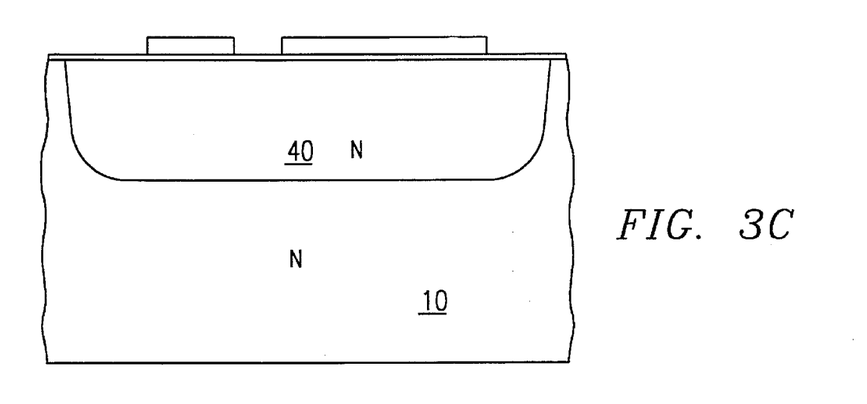

FIG. 3C shows the result of a diffusion step which causes n-type dopant 40A to form HV n-well 40. The diffusion drives the dopants into substrate 10 to a depth of approximately 8 um. An n-type impurity concentration of approximately $1.5e16/cm^3$ is sufficient for n-well 40.

Figure 3D:
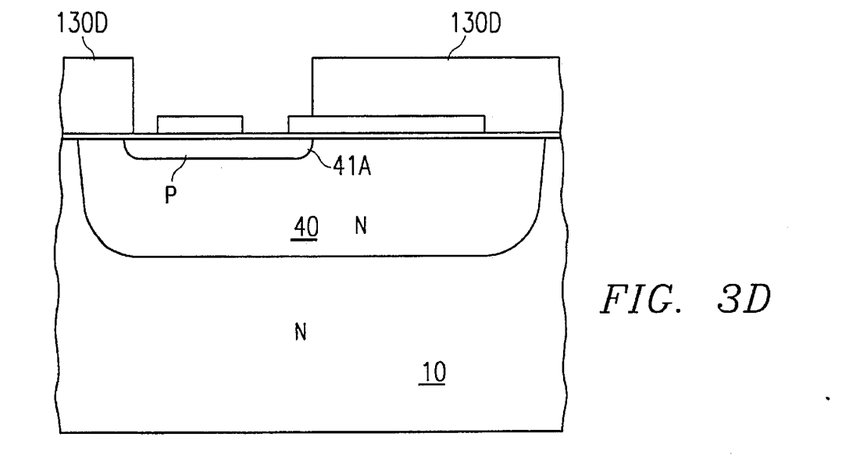

FIG. 3D shows p-type implant 41A after being implanted. P-type dopant 41A can be boron, for example. Photoresist 130D blocks dopant 41A from undesired insertion. Dopant 41A is implanted within n-well 40.

Figure 3E:
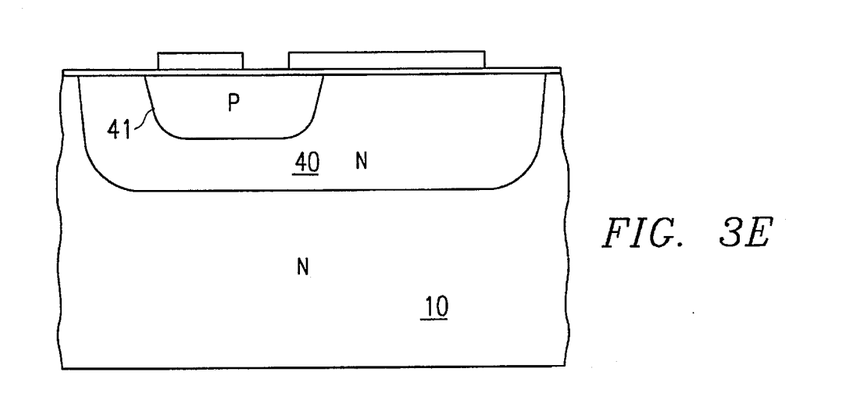

FIG. 3E shows the result of a diffusion step that forms HV drift region p-tank 41. The depth of drift region 41 is limited to about 1–2 um so that when a depletion region is formed in drift region 41 in response to the application of a source to drain voltage ($V_{Ds}$), the resulting field will impinge on the surface of the device and thereby reduce the voltage gradient on the surface, according to the well known operation of a RESURF device. A p-type impurity concentration of approximately $8.0e16/cm^3$ is sufficient for drift region p-tank 41.

Figure 3F:
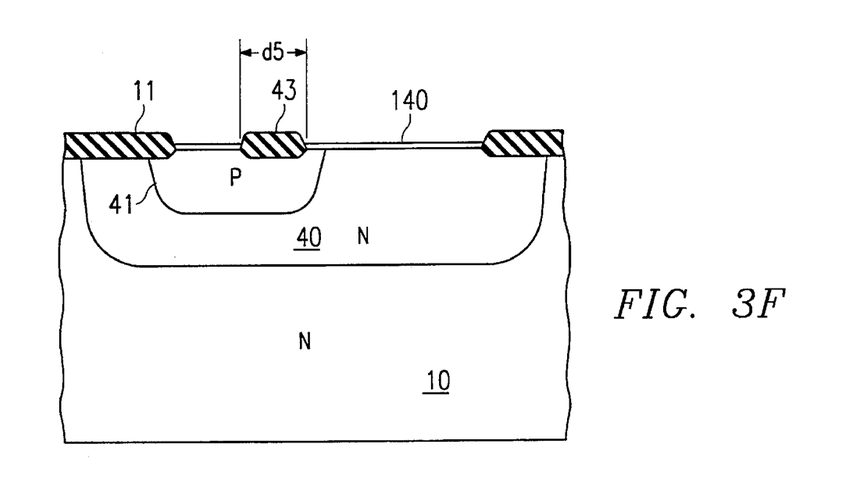

FIG. 3F shows a field oxide 11, and gate field oxide 43 that are grown thermally on areas which are not covered with nitride 120. The width d5 of gate field oxide 43 is determined by the size of the opening in nitride layer 120. The minimum size of width d5, commonly referred to as the minimum grown feature size, is dependent on the process used to form the opening in nitride layer 120. In this embodiment, the minimum size opening that can be made in the nitride is approximately 1.5 um. The width d5 is approximately 3.0 um. After oxide growth, nitride 120 is removed. Dummy oxide 140 is then grown over the exposed areas.

Figure 3G:
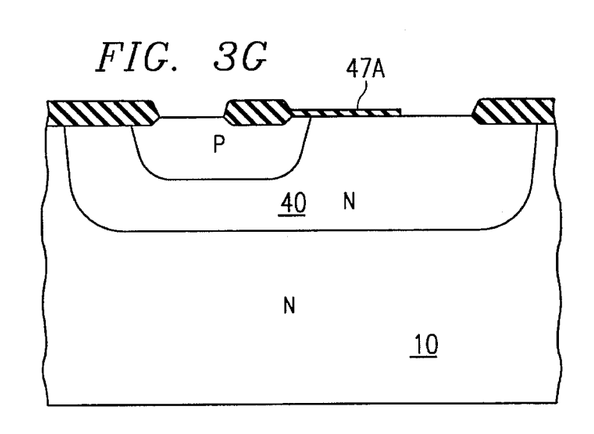

FIG. 3G shows a partial HV gate oxide 47A which is formed by depositing oxide over the device, patterning, and etching the oxide layer. The thickness of oxide 47A is selected so that the oxide added in a following step will combine to create the target thickness for an HV gate oxide 47, shown in FIG. 3I. Partial HV gate oxide 47A may be 800 Å thick, for example.

Figure 3H:
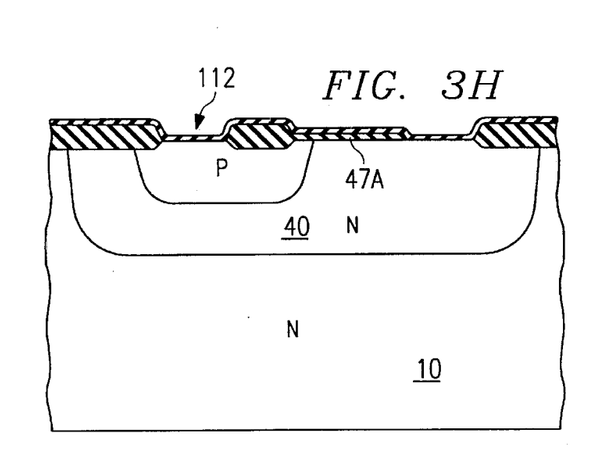

FIG. 3H shows a thin oxide layer 112 which is formed by depositing oxide over the device. Oxide layer 112 may form a gate oxide of a low voltage device not shown. Oxide layer 112 overlies partial gate oxide 47A. Oxide layer 112 may be approximately 350 Å thick, for example. Oxide layer 112 and partial gate oxide 47A together comprise gate oxide 47 shown in FIG. 3I.

Figure 3I:
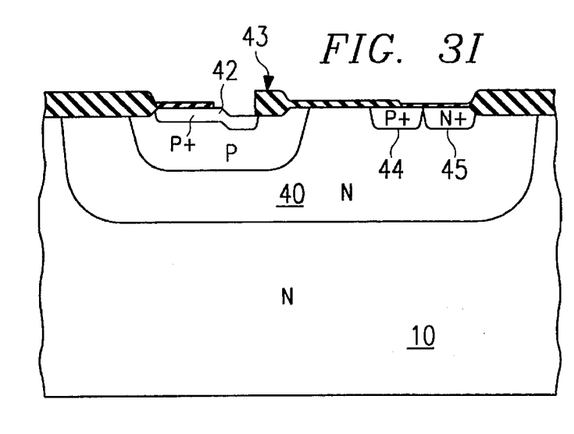

FIG. 3I shows the result of masking and etching field oxide 43, according to the present invention, to form a truncated gate field oxide 43 which is smaller than the minimum grown feature size. A p+ dopant 42 is implanted in drift region 41 forming drain 42. A p+ dopant 44 is implanted in n-well 40 forming source 44. A photoresist, not shown, blocks dopant 42 and dopant 44 from undesired insertion. Truncated field oxide 43 allows drain 42 to be inserted advantageously close to channel region 49.

Figure 3J:
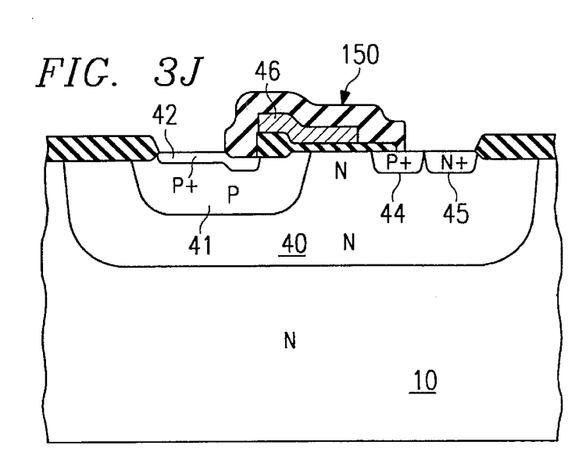

In FIG. 3J, polysilicon is deposited and etched to form HV gate electrode 46. HV n+ n-well contact 45 is implanted. Drain 42, source 44 and contact 45 may be diffused to approximately the same depth. A layer of thick oxide is deposited over the device, masked and etched to form inter-level oxide 150. Referring to FIG. 2, drain contact 101 and source contact 103 are formed by depositing a conductive material, such as polysilicon, over the device, masking and etching. Well known steps can be followed to complete the integrated circuit.

Referring again to FIG. 2, the amount that gate field oxide 43 is truncated is dependant on the planned operating voltage of device 7. The distance d2 must be long enough so that a drain to source voltage ($V_{ds}$) applied across drain contact 101 and source contact 103 does not cause a voltage breakdown in RESURF drift region 41. The breakdown voltage of drift region 41 is determined by distance d2 and the impurity concentration of drift region 41. Distance d1 is selected so that after taking into account the lateral diffusion distance of drain 42, distance d1 is as short as possible without breaking down to advantageously minimize the bulk resistance of drift region 41. The impurity concentration of drift region 41 may be advantageously selected so that distance d2 is minimized.

$R_{ds(on)}$ of device 7 comprises bulk resistance of the drift region 41 and bulk resistance of channel 49. Bulk resistance of drift region 41 may be a significant part of $R_{ds(on)}$ of device 7; minimizing the bulk resistance of drift region 41 advantageously reduces $R_{ds(on)}$. For example, a PMOS device rated to operate with a $V_{ds}$ of approximately 30 volts may be constructed with distance d1 approximately 1.4 um and distance d2 approximately 2.2 um. $R_{ds(on)}$ may be approximately 1.8 mohm-$cm^2$. A prior art device 7, as shown in prior art FIG. 1, may have distance d1 approximately 3.0 um, and distance d2 approximately 3.8 um. $R_{ds(on)}$ of prior art device 7 may be approximately 2.4 mohm-$cm^2$.

In general, if $R_{ds(on)}$ of prior art device 7 is dominated by the resistance of channel 49, then $R_{ds(on)}$ of device 7 may be approximately 5% to 10% lower than $R_{ds(on)}$ of prior art device 7. If $R_{ds(on)}$ of prior art device 7 is dominated by the bulk resistance of drift region 41, then $R_{ds(on)}$ of device 7 may be approximately 15% to 25% lower than $R_{ds(on)}$ of prior art device 7.

Still referring to FIG. 2, extended drain 42 has a larger area of contact with drift region 41 than prior art device 7, which also advantageously reduces $R_{ds(on)}$ of device 7.

The invention can be advantageously applied to many forms of high voltage PMOS and high voltage NMOS transistors used in smart power devices which are designed to operate with a drain to source voltage of approximately 15 v to 100 v. The invention can be advantageously applied to many forms of HV PMOS and HV NMOS discrete transistors which are designed to operate with a drain to source voltage of approximately 15 v to 100 v.

Another advantage of the current invention is that a high voltage MOS device may be made smaller due to the lower specific $R_{ds(on)}$. This may advantageously permit more high voltage MOS devices to be placed on one integrated circuit.

Another advantage of the current invention is that a high voltage MOS device may be made smaller due to shorter distance d1. This may advantageously permit more high voltage MOS devices to be placed on one integrated circuit.

The present invention may advantageously be embodied using various topological shapes, such as a square drift region 41 or a rounded drift region 41, for example.

Another advantage of the current invention is that it requires no additional mask steps and is adaptable to most CMOS and CMOS/SOI fabrication processes.

Another advantage of the current inventions is that it allows a high voltage device to be optimized independently of other types of devices on the integrated circuit so that $R_{ds(on)}$ of the high voltage device is minimized.

While the invention has been described with reference to illustrative embodiments, this description is not intended to be construed in a limiting sense. Various other embodiments of the invention will be apparent to persons skilled in the art upon reference to this description. For example, a non-exclusive set of alternate examples of various elements are given in Table B. An alternate embodiment may use either N or P type substrate 10 since the device is isolated by well 40 in the preferred embodiment. An alternate embodiment may use a single oxide deposition to form gate oxide 47. An alternate embodiment may use an epi layer under a lightly doped RESURF region or other configurations instead of well 40.

FIGS. 3A–3J illustrate the formation of a high voltage PMOS device. A high voltage NMOS device can be formed with similar steps by substituting n-type dopant where p-type dopant is indicated and by substituting p-type dopant where n-type dopant is indicated in FIG. 2 and FIGS. 3A–3J. Referring to FIG. 2, n+ drain 42 of high voltage NMOS device 7 is adjacent to truncated gate field oxide 43 and advantageously close to channel region 49.

The present invention may be embodied in single sided transistor having a single gate field oxide 43 and source 44 as shown in FIG. 2, or in a mirror image transistor having multiple gate field oxide 43's and source 44's.

It is therefore the intention that the appended claims be interpreted as broadly as possible in view of the prior art to include all such variations and modifications.

TABLE A

| Element | Element Name |
|---|---|
| 6 | HV NMOS transistor |
| 7 | HV PMOS transistor |
| 10 | semiconductive substrate |
| 20 | HV p-well |
| 21 | HV drift region (n)-tank |
| 22 | HV n+ drain |
| 23 | HV NMOS gate field oxide |
| 27 | HV NMOS gate oxide |
| 29 | HV NMOS channel region |
| 40 | HV n-well |
| 41 | HV drift region (p)-tank |
| 42 | HV p+ drain |
| 43 | HV PMOS gate field oxide |
| 44 | HV p+ source |
| 45 | HV n+ n-well contact region |
| 46 | HV PMOS gate electrode |
| 47 | HV PMOS gate oxide |
| 49 | HV PMOS channel region |
| 101 | HV drain electrode |
| 103 | HV source electrode |
| 110 | 1st oxide |
| 112 | thin oxide |
| 120 | nitride layer |
| 130 | photoresist pattern |
| 140 | dummy oxide |
| 150 | interlevel oxide |

TABLE B

| Element | Function | Specific embodiment HVPMOS rated breakdown = 30 v. | Alternate examples HV breakdown = approx 15–80 v. |
|---|---|---|---|
| 10 | foundation for active elements | 8–12 ohm-cm (n−) Si | 8–12 onm-cm (p−) Si |
| 40 | localized semiconductive substrate well | formed (n), approx 1.5e16/cm³ approx 8 um deep | approx 1.0e15–5.0e16/cm³ approx 4.0–10 um deep |
| 41 | drain depletion region to reduce the surface field | formed boron (p), approx 8.0e16/cm³, approx 1.1 um deep | approx 0.1–3.0 e17/cm³ approx 1.0–2.5 um |
| 42 | highly conductive drain contact region | formed (p+), approx 1.0e19/cm³ approx 0.5 um deep | |
| 43 | insulate gate from drain and drift region | thermal Si oxide, approx 9300 Å | |
| 44 | source region | formed (p+), approx 1.0e19/cm³, approx 0.5 um deep | |
| 45 | highly conductive tank contact region | formed (n+), approx 1.0e19/cm³, approx 0.5 um deep | |
| 46 | gate electrode | poly Si | metal, such as Al, Cu |
| 47 | insulate gate from channel region | deposited Si oxide, aprox 1000 Å | |
| 49 | semiconductive region | formed (n) | |
| 101 | drain electrode | poly Si | a) metal, such as Al, Cu b) refractory metal silicide |

TABLE B-continued

| Element | Function | Specific embodiment HVPMOS rated breakdown = 30 v. | Alternate examples HV breakdown = approx 15–80 v. |
|---|---|---|---|
| 103 | source electrode | poly Si | a) metal, such as Al, Cu<br>b) refractory metal silicide |
| 110 | etch stop for nitride, protect crystal surface | thermal oxide, approx 400 Å | |
| 112 | low voltage gate oxide, part of high voltage gate | deposited oxide, approx 350 Å | |
| 120 | mask for field oxide | deposited Si$_3$N$_4$, approx 1200 Å | |
| 130 | mask for implants | | |
| 140 | protect crystal surface | thermal oxide, approx 400 Å | |
| 150 | insulate level 1 interconnect from level 2 | deposited SiO$_2$ | |

What is claimed is:

1. A high voltage metal oxide semiconductor, MOS, device comprising:

a first lightly doped region of a first conductivity type;

a first heavily doped region of said first conductivity type in direct contact with said first lightly doped region;

a second heavily doped region of said first conductivity type spaced apart from said first lightly doped region;

a second lightly doped region of a second conductivity type disposed between said first lightly doped region and said second heavily doped region; and a gate comprising a first conductive region overlying a portion of each of said first lightly doped region, said first heavily doped region and said second lightly doped region.

2. The MOS device of claim 1, further comprising a second conductive region connected to said first heavily doped region.

3. The MOS device of claim 2, further comprising a third conductive region connected to said second heavily doped region.

4. The MOS device of claim 3, further comprising an insulative region disposed between said first conductive region and said first lightly doped region, said first heavily doped region and said second lightly doped region.

5. The MOS device of claim 4, wherein said insulative region has a first thickness between said first conductive region and said first heavily doped region and a second thickness between said first conductive region and said second lightly doped region such that said first thickness is at least twice the thickness of said second thickness.

6. The MOS device of claim 5, wherein said second lightly doped region forms a well in a substrate and said first lightly doped region and said second heavily doped region are formed within said second lightly doped region.

7. The MOS device of claim 5, wherein said first conductive region overlies a portion of said second heavily doped region.

8. The MOS device of claim 5, further comprising a third conductive region connected to said second heavily doped region.

9. A high voltage metal oxide semiconductor, MOS, device comprising:

a first heavily doped region of a first conductivity type;

a second heavily doped region and a third heavily doped region of said first conductivity type;

a first lightly doped region of said first conductivity type disposed between said first and second heavily doped regions in direct contact with said first heavily doped region and spaced apart from said second heavily doped region;

a third lightly doped region of said first conductivity type disposed between said first and third heavily doped regions in direct contact with said first heavily doped region and spaced apart from said third heavily doped region;

a second lightly doped region of a second conductivity type disposed between said first lightly doped region and said second heavily doped region;

a fourth lightly doped region of said second conductivity type disposed between said third lightly doped region and said third heavily doped region;

a first gate comprising a first conductive region overlying a portion of each of said first lightly doped region, said first heavily doped region and said second lightly doped region;

a second gate comprising a fourth conductive region overlying a portion of each of said third lightly doped region, said first heavily doped region and said fourth lightly doped region.

10. The MOS device of claim 9, further comprising a second conductive region connected to said first heavily doped region.

11. The MOS device of claim 10, further comprising a third conductive region connected to said second heavily doped region and a fifth conductive region connected to said third heavily doped region.

12. The MOS device of claim 11, further comprising:

a first insulative region disposed between said first conductive region and said first lightly doped region, said first heavily doped region and said second lightly doped region; and a second insulative region disposed between said fourth conductive region and said third lightly doped region, said first heavily doped region and said fourth lightly doped region.

13. The MOS device of claim 12, wherein:

said first insulative region has a first thickness between said first conductive region and said first heavily doped region and a second thickness between said first conductive region and said second lightly doped region such that said first thickness is at least twice the thickness of said second thickness; and said second insulative region has approximately said first thickness between said fourth conductive region and said first heavily doped region and approximately said second thickness between said fourth conductive region and said fourth lightly doped region.

14. The MOS device of claim 13, wherein said second lightly doped region and said fourth lightly doped region jointly form a well in a substrate such that said first lightly doped region, said third lightly doped region, said second heavily doped region and said third heavily doped region are formed within said well.

15. The MOS device of claim 13, wherein said first conductive region overlies a portion of said second heavily doped region.

16. The MOS device of claim 13, further comprising:

a third conductive region connected to said second heavily doped region; and a fifth conductive region connected to said third heavily doped region, said MOS device thereby being a mirror image MOS device.

* * * * *